United States Patent
Wang

(10) Patent No.: US 9,915,475 B2
(45) Date of Patent: Mar. 13, 2018

(54) ASSEMBLED REACTOR FOR FABRICATIONS OF THIN FILM SOLAR CELL ABSORBERS THROUGH ROLL-TO-ROLL PROCESSES

(76) Inventor: Jiaxiong Wang, Castro Valley, CA (US)

(*) Notice: Subject to any disclaimer, the term of this patent is extended or adjusted under 35 U.S.C. 154(b) by 1986 days.

(21) Appl. No.: 13/084,568

(22) Filed: Apr. 12, 2011

(65) Prior Publication Data

US 2012/0264075 A1    Oct. 18, 2012

(51) Int. Cl.
| | |
|---|---|
| *F27B 17/00* | (2006.01) |
| *H01L 21/67* | (2006.01) |
| *H01L 21/677* | (2006.01) |
| *H01L 31/032* | (2006.01) |
| *H01L 31/0392* | (2006.01) |
| *H01L 31/18* | (2006.01) |

(52) U.S. Cl.
CPC ...... *F27B 17/0025* (2013.01); *H01L 21/6776* (2013.01); *H01L 21/67109* (2013.01); *H01L 21/67173* (2013.01); *H01L 31/0322* (2013.01); *H01L 31/03926* (2013.01); *H01L 31/03928* (2013.01); *H01L 31/1836* (2013.01); *Y02E 10/541* (2013.01)

(58) Field of Classification Search
None
See application file for complete search history.

(56) References Cited

U.S. PATENT DOCUMENTS

| | | | |
|---|---|---|---|
| 3,778,221 A * | 12/1973 | Bloom | 432/11 |
| 3,934,970 A * | 1/1976 | McMaster et al. | 432/121 |
| 4,385,945 A * | 5/1983 | Compton et al. | 148/657 |
| 4,914,276 A * | 4/1990 | Blair | 219/390 |
| 5,683,518 A * | 11/1997 | Moore et al. | 118/730 |
| 5,710,407 A * | 1/1998 | Moore et al. | 219/405 |
| 5,861,609 A * | 1/1999 | Kaltenbrunner et al. | 219/390 |
| 6,051,512 A * | 4/2000 | Sommer et al. | 438/795 |
| 6,152,068 A * | 11/2000 | Colson et al. | 118/46 |
| 6,288,366 B1 * | 9/2001 | Dings | 219/388 |
| 6,342,691 B1 * | 1/2002 | Johnsgard et al. | 219/390 |
| 6,703,589 B1 * | 3/2004 | Probst | 219/390 |
| 6,887,803 B2 * | 5/2005 | Yoo | 438/795 |
| 7,358,200 B2 * | 4/2008 | Yoo | 438/795 |
| 7,745,762 B2 * | 6/2010 | Timans | 219/390 |

(Continued)

FOREIGN PATENT DOCUMENTS

WO    WO 2011/018226 A1 *    2/2011

*Primary Examiner* — Nathaniel Herzfeld

(57) ABSTRACT

A roll-to-roll reactor, which is assembled with an RTP (Rapid Thermal Process) compartment, a cooling compartment, and a series of modular heating sections, is provided. Its length is adjustable by adding or reducing numbers of the modular heating sections according to required reaction time and delivery speed of a continuous flexible workpiece. The reactor contains a reaction oven, assembled with a series of modular thermal control components, included inside a vacuum-tight reaction chamber. The oven temperature can be precisely controlled through combinations of heating elements, thermocouples and cooling tubing. The present reactor can be used for annealing and reaction of various precursor films on flexible substrates under vacuum and in inert or reactive gas ambient at temperatures ranging from room temperature to a thousand of Celsius degrees through a continuous roll-to-roll process.

6 Claims, 3 Drawing Sheets

(56) References Cited

U.S. PATENT DOCUMENTS

| | | | |
|---|---|---|---|
| 8,039,289 B2* | 10/2011 | Parks et al. | 438/72 |
| 8,110,045 B2* | 2/2012 | Yoneda et al. | 118/725 |
| 8,192,132 B2* | 6/2012 | Krause et al. | 414/217 |
| 8,430,966 B2* | 4/2013 | Rathweg et al. | 118/726 |
| 2004/0089237 A1* | 5/2004 | Pruett et al. | 118/719 |
| 2009/0130825 A1* | 5/2009 | Nakamura et al. | 438/478 |
| 2009/0148598 A1* | 6/2009 | Zolla et al. | 427/251 |
| 2009/0183675 A1* | 7/2009 | Pinarbasi et al. | 118/500 |
| 2009/0305449 A1* | 12/2009 | Bollman et al. | 438/57 |
| 2010/0040991 A1* | 2/2010 | Chung et al. | 432/1 |
| 2010/0087016 A1* | 4/2010 | Britt et al. | 438/7 |
| 2010/0139557 A1* | 6/2010 | Basol | 118/67 |
| 2010/0226629 A1* | 9/2010 | Basol et al. | 392/407 |
| 2011/0033610 A1* | 2/2011 | Bertram, Jr. | 427/8 |
| 2011/0039219 A1* | 2/2011 | Kressmann et al. | 432/77 |
| 2011/0256656 A1* | 10/2011 | Wang | 438/62 |
| 2012/0171632 A1* | 7/2012 | Novak et al. | 432/14 |
| 2012/0231574 A1* | 9/2012 | Wang | 438/95 |
| 2013/0005073 A1* | 1/2013 | Wang | 438/86 |
| 2013/0224901 A1* | 8/2013 | Wang | 438/95 |
| 2013/0309799 A1* | 11/2013 | Wang | 438/62 |
| 2013/0330874 A1* | 12/2013 | Wang | 438/86 |

* cited by examiner

ASSEMBLED REACTOR FOR FABRICATIONS OF THIN FILM SOLAR CELL ABSORBERS THROUGH ROLL-TO-ROLL PROCESSES

FIELD OF THE INVENTION

The present invention relates to a reactor that can be assembled with modular sections to fabricate multiple component semiconductor materials that can be used in thin film solar cells as absorbers or other fields of applications. With a high vacuum design and a precise temperature control, this apparatus is invented for the reaction of flexible substrates through roll-to-roll or reel-to-reel processes.

BACKGROUND

Photovoltaic devices have recently been dramatically developed due to serious global warming and expectation of fossil fuel exhausting in the near future. The traditional photovoltaic devices, or solar cells, are based on silicon semiconductors such as single or multiple crystal silicon materials. However, these silicon materials are expensive, difficult for fabrication and in short supply in semiconductor industry. To overcome these problems, some substitutes such as thin film solar cells have been developed as the second generation of solar cells. At present, there are three main types of second generation thin film solar cells: amorphous silicon, CIGS and CdTe. In this thin film solar cell family, the CIGS solar cells possess the highest conversion efficiency that is as high as 20%, higher than 16% efficiency of the CdTe ones. In the periodic table of the elements, the elements of a CIGS absorber are located in Group IB-IIIA-VIA and the ones of CdTe absorber in Group IIB-VIA. These absorber materials all belong to multi-component p-type semiconductors. For such a semiconductor material, the distribution of different components, stoichiometry and crystal style may determine the quality of the materials.

Both of CIGS and CdTe solar cells contain a stack of absorber/buffer thin film layers to create an efficient photovoltaic heterojunction. A metal oxide window containing a highly resistive layer, which has a band gap to transmit the sunlight to the absorber/buffer interface, and a lowly resistive layer to minimize the resistive losses and provide electric contacts, is deposited onto the absorber/buffer surface. This kind of design significantly reduces the charge carrier recombination in the window layer and/or in the window/buffer interface because most of the charge carrier generation and separation are localized within the absorber layer. In general, CIGS solar cell is a typical case in Group IB-IIIA-VIA compound semiconductors comprising some of the Group IB (Cu, Ag, Au), Group IIIA (B, Al, Ga, In, Tl) and Group VIA (O, S, Se, Te, Po) elements of the periodic table, which are excellent absorber materials for thin film solar cells. In particular, compounds containing Cu, In, Ga, Se and S are generally referred to as CIGS(S), or $Cu(In,Ga)(S,Se)_2$ or $CuIn_{1-x}Ga_x(S_ySe_{1-y})_n$, where $0 \leq x \leq 1$, $0 \leq y \leq 1$ and n is approximately 2, and have already been applied in the solar cell structures that gave rise to conversion efficiencies approaching 20%. Here, $Cu(In,Ga)(S,Se)_2$ means the whole family of compounds with Ga/(Ga+In) molar ratio varying from 0 to 1, and Se/(Se+S) molar ratio varying from 0 to 1. It should be noted that the molar ratios of Ga/(Ga+In) and Cu/(Ga+In) are very important factors to determine the compositions and the conversion efficiencies of the CIGS solar cells. In general, a good solar cell requires a ratio of Cu/(Ga+In) between 0.75 and 0.95, and Ga/(Ga+In) between 0.3 and 0.6. In comparison with CIGS, the composition of a CdTe solar cell is much simple. The content of Cd is usually close to 50% in the CdTe films. However, the Cd content may change after the deposition of a CdS layer and the subsequent annealing procedure. Close to the interface of the p-n-junction, for example, a $CdS_xTe_{1-x}$ layer is formed with x usually not exceeding 0.06. However, x has a range changing from 0 to 1, which results in a compound from CdTe (x=0) to CdS (x=1).

Both CIGS and CdTe films has to be annealed to form a uniform stoichiometric compound. A CIGS film is usually annealed at a temperature between 350 and 600° C. in a typical two-stage fabrication procedure. For a CdTe solar cell, a CdS film may firstly be annealed in a superstrate configuration and a CdS/CdTe bilayer may be annealed in a substrate configuration. The importance of annealing is not only for the formation of a stoichiometric semiconductor material, but also for the determination of the crystal and boundary structures that may seriously affect the semiconductor properties. Therefore, the annealing should be well controlled in a carefully designed apparatus. For example, a CIGS film is usually going through a Rapid Thermal Processing (RTP) to approach a high temperature quickly at the beginning, followed by a reaction at the raised temperature in a super-pure inert, $H_2Se$, $H_2S$ or Se atmosphere. After annealing, an n-type semiconductor buffer layer such as CdS, ZnS, or $In_2S_3$ should be deposited onto a CIGS semiconductor absorber. After then, transparent conductive oxide (TCO) materials, i.e., ZnO, $SnO_2$, and ITO (indium-tin-oxide), should be deposited to form the solar cells.

The annealing process is sensitive to any impure species. For example, any residue oxygen or water inside a reactor may oxidize a CIGS absorber and destroy this semiconductor material. Therefore, an annealing reactor has to be totally isolated from the outside atmosphere. A vacuum apparatus should be helpful to clean the interior chambers at the beginning through some vacuum-inert gas cycles and remain a good sealing for the equipment during the reactions. However, most of high temperature reactors may not be designed as high vacuum apparatus. For these equipments, lots of inert gas has to be used to remain the annealing under a pure inert atmosphere. Especially for a roll-to-roll or reel-to-reel continuous process, more attention has to be paid to design a qualified reactor. Some high vacuum apparatus has recently been patented and assigned to Solo-Power as a roll-to-roll reactor to anneal CIGS absorbers. For example, a few patent applications have been presented to provide methods and a high vacuum reactor to selenize and anneal CIGS absorbers in a roll-to-roll process, as shown in patent applications with publication numbers US2009/0183675A1, US2009/0148598A1 and US2010/0139557A1. With their designs, the reactor comprises a primary gap defined by a peripheral wall and an insert is placed within the gap to process the reaction of a continuously traveling workpiece. This insert processing gap is vacuum-tight and an inert or reactive gas can be introduced during the reaction under a certain temperature controlled by some heating elements surrounding the peripheral wall.

The main drawback for this reactor is that its integrated design requires a continuous piece of the peripheral wall. When the reaction needs time, the peripheral wall has to be designed very long or the travelling speed of the workpiece has to be very slow. The long peripheral wall may significantly increase the cost and the difficulty of fabrication, transportation and maintenance. In addition, the heating elements surrounding the body also significantly increase the temperature of the working environment. To solve these problems, the present invention provides a vacuum-tight reactor comprised with a series of modular sections. Moreover, the heating elements have been incorporated inside the reactor chamber that may be isolated with a vacuum chamber.

SUMMARY OF THE INVENTION

The present invention provides a reactor that can be assembled with some modular sections to fabricate thin film solar cell absorbers in a roll-to-roll or reel-to-reel process. This apparatus features a vacuum tight sealing and a precise temperature control. A flexible substrate is continuously delivered through this reactor that can be assembled to obtain various lengths according to requirements of the reaction time and the substrate delivery speeds.

This apparatus can be used for annealing materials deposited on the flexible substrates under a vacuum or inert atmosphere and/or carrying out the material reactions in different reaction gases. In particular, it may be used to anneal and/or conduct reaction of semiconductive absorber layers in Group IB-IIIA-VIA and Group IIB-VIA thin film solar cells.

DETAILED DESCRIPTION OF THE INVENTION

The apparatus in the present invention can be used for annealing or reaction of a single or multiple layer thin film coating on a flexible foil substrate, which is useful in preparation of semiconductor absorbers in Group IB-IIIA-VIA or Group IIB-VIA thin film solar cells. It can also be employed in the annealing and reaction processes in other applications. In general, such annealing and reactions may be divided into three groups, under vacuum, under an inert gas environment, or in a reaction gas atmosphere. The present invention meets all of these conditions. The apparatus is designed for operation under a high vacuum environment. With several vacuum and inert gas cycles, the whole process can be conducted under a very pure inert environment. If a toxic gas is applied in a reaction, such as $H_2S$ or $H_2Se$ in preparation of Group IB-IIIA-VIA thin film solar cells, this apparatus can provide a double protection from leaking. Moreover, a combination of heating elements and thermocouples in the modular thermal control component can provide a precise temperature for both constant temperature reaction and a rapid thermal process (RTP). The apparatus in the present invention can be manufactured in different widths to adapt to the substrate widths.

Figure 1:
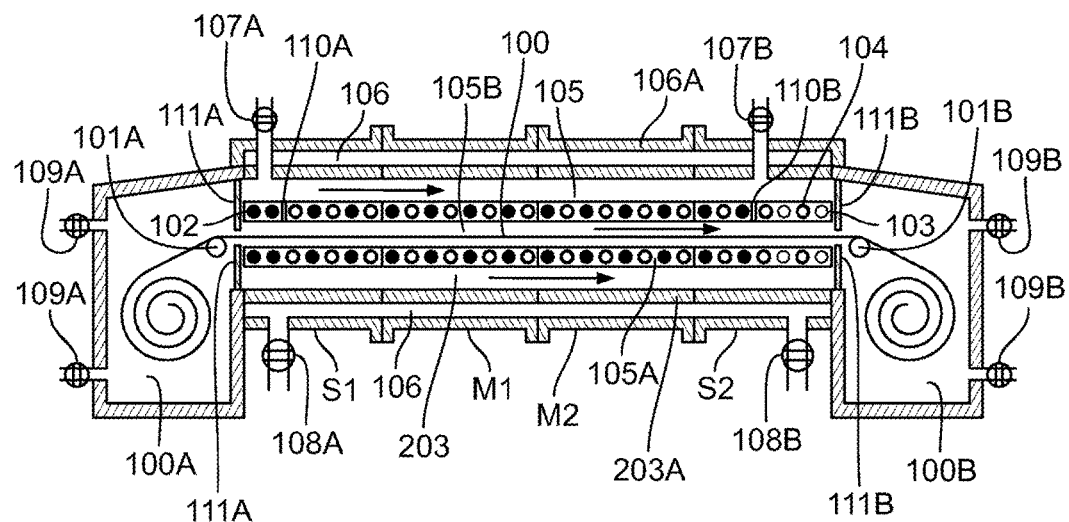
FIG. 1 shows an apparatus with two modular heating sections in the center for reaction of a precursor layer coated on a flexible foil substrate to fabricate an absorber layer in a Group IB-IIIA-VIA or IIB-VIA solar cell with a roll-to-roll process.

In an embodiment as shown in FIG. 1, a reactor includes a roll unwinding chamber 100A, an RTP compartment S1, at least one modular heating sections M1 (and as shown, M2 in series, and a cooling compartment S2, plus a roll winding chamber 100B. The flexible substrate roll 100 is delivered from the unwinding chamber (100A), through the rollers 101A and 101B, to the winding chamber (100B) along the arrow direction with a certain speed. The unwinding chamber 100A is directly connected to the RTP compartment S1 where the substrate is quickly heated up to a constant annealing or reaction temperature with a RTP process. Then the substrate goes through a heating zone in the annealing/reaction oven 105 that is constituted with a series of modular thermal control components 105A in modular heating sections M1, M2 . . . before it passes the cooling compartment S2 that is directly connected to the winding chamber 100B. In addition to the modular thermal control components, every of the modular heating sections, the RTP compartment and the cooling compartment includes one or more modular reaction chamber wall 203A which encloses a reaction chamber 203. The reaction oven 105 possesses an oven space 105B enclosed by said one or more modular thermal control components 105A, one or more pieces of heating elements 102, one or more pieces of cooling tubing 103, one or more pieces of thermocouples 104, one or more gas inlets 110A to said oven space, and one or more gas outlets 110B to said oven space. The gas inlets 110A and the gas outlets 110B may also play as roles of vacuum outlets during a vacuum process. The oven space 105B has a central internal height between 10 and 200 millimeters, and an internal bottom width between 100 and 2000 millimeters. The reaction oven is configured in such a way that a flexible substrate can be delivered through it. The cooling tubing in S2 may be constituted from some stainless steel tubing loaded with flowing cold water or cold air. The heating elements used in the RTP compartment and the modular heating sections may be made of some exotic materials such as molybdenum, molybdenum disilicide, or some highly resistant metallic alloy wires. The thermocouples used with the modular thermal control components are usually metallic alloy wires to detect and precisely control the temperatures inside the oven. The whole annealing/reaction oven 105 expended from S1 to S2 may be fabricated from the materials of graphite, ceramic or quartz crystal. The heating elements 102 and the cooling tubing 103 can be installed inside a modular thermal control component as illustrated in FIG. 1 or arranged above and underneath it, combined with the thermocouples 104. The heating elements and the cooling tubing combined with the thermocouples are densely arranged along these modular thermal control components and independently controlled to guarantee that the whole precursor film on the flexible substrate 100 is annealed or reacted at a constant temperature ±1° C. The temperature inside said reaction oven 105 is adapted to be controllable from 25° C. to 1000° C.

In one aspect of the embodiment, the length of the reactor is adjustable by adding or reducing numbers of the modular heating sections. The entire reaction chamber 203, included in the seriesly connected RTP compartment S1, modular heating sections M1, M2 . . . and cooling compartment S2, substantially surrounds said annealing/reaction oven 105. The reaction chamber has at least a gas inlet 107A and a gas outlet 107B, which are also used for vacuum valves by connecting them to vacuum pumps. The reaction chamber 203, the roll unwinding chamber 100A and the roll winding chamber 100B are joined together to form a main vacuum chamber that is adapted to be capable of being vacuumed down to 1 Pascal (Pa), preferably $10^{-3}$ Pa. In order to reach such a high vacuum, some modular heating sections may have to be equipped with vacuum outlets connected to turbomolecular pumps that can cooperate with main oil-free dry mechanical pumps to achieve a high vacuum. If the reaction requires only $10^{-3}$ Torr (1 Toll=133.3 Pa) vacuum, these turbomolecular pumps may not be necessary. There are one or more vacuum/gas valves 109A connected to the unwinding chamber and 109B connected to the winding chamber, as illustrated in FIG. 1. In addition, either of said unwinding chamber and said winding chamber possesses a pair of shutters 111A or 111B installed between the unwinding chamber and the RTP compartment, or between the winding chamber and the cooling compartment, above and underneath the travelling substrate. As shown in FIG. 1, the reaction chamber 203 is actually a segment of the main vacuum chamber between two pairs of shutters 111A and 111B. The opening width of the shutters is adjustable between 1 and 200 millimeters to control the gas flow.

In another aspect of the embodiment, the reactor further includes an outer vacuum chamber wall 106A. The outer vacuum chamber wall 106A encloses an outer vacuum chamber 106 that substantially surrounds the whole reaction chamber 203. There are one or more vacuum valves such as 108A and 108B equipped to this outer vacuum chamber to vacuum the chamber 106 to about 1 Pa during operation of said reactor. One or more channels (not drawn) may be set up to connect the outer vacuum chamber and the reaction chamber with valves to turn on/off communication between these two chambers, if necessary.

Before the RTP and the reaction start, the substrate roll 100 is loaded in the reactor. The whole system is then carried out at least three cycles of vacuum-inert gas operation to remove any impurity from the apparatus. During these cycles, the valves 107A and 107B may be closed, and 109A and 109B are opened. One of the valves 109A and one of 109B are used as the vacuum outlets and the rest two as the inert gas inlets. When the system is ready, the annealing/reaction oven 105 starts to heat the temperature up to a certain degree. During this process, the valve 108A and/or 108B are opened to a vacuum system. Then the roll 100A starts to move along the arrow direction and the gas valve 107A and 107B are opened to introduce the inert or reaction gas into 107A and out of 107B if the annealing or the reaction is not conducted under a vacuum. The gas can penetrate a group of hole inlets 110A and escape out of a group of hole outlets 110B before it reaches the cooling compartment. For a better control of a gas flow inside the reaction oven 105, the gas inlets 110A may be directly connected to an external gas valve (not shown) and the gas outlets 110B may be directly led to the valve 107B. For an annealing or a reaction of a CIGS precursor layer under an inert gas environment, the gas escaped from 110B may contain lots of Se vapors. If a formation of the CIGS absorber is required in a $H_2S$ or $H_2Se$ atmosphere, the escaped gas is very toxic, especially for the fatal $H_2Se$. The reaction gas is firstly controlled inside the reaction chambers. During the reaction, the shutters 111A and 111B are almost closed to leave narrow slits for the roll movement. The width of these slits may be set from 1 to 10 millimeters (mm), preferably around 4-8 mm. The inert gas with a positive pressure from 109A and 109B is introduced through these slits to avoid the toxic gas leaking into the unwinding and winding chambers. The escaped gas from the valve 107B is finally introduced to a treatment system (not shown). The outer vacuum chamber 106 is remained under a vacuum during the whole annealing or reaction process. It has two main functions. On one hand, it is a thermal insulation buffer space to resist too much heat released to the air and stabilize the temperature in the reaction chambers. On the other hand, 106 is a protection chamber for any possible gas leaking from the reaction chamber because the leaked gas can be vacuumed and led to the external chemical treatment system.

Figure 2:
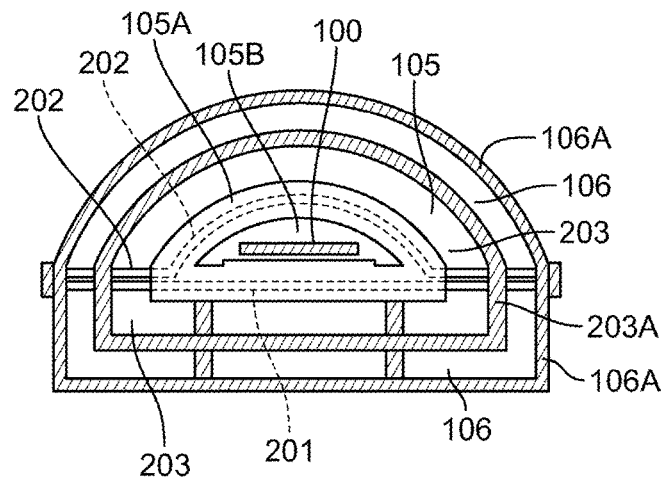
FIG. 2 is the cross-section view of a modular heating section of the apparatus shown in FIG. 1.

FIG. 2 shows a cross-section view of a modular heating section. A flexible substrate 100 is illustrated inside the oven space 105B enclosed by the modular thermal control component 105A that contains the heating element and the thermocouple combination. A modular thermal control component includes one bottom piece 201 and one top piece 202. There are certain coupling mechanism between the arc shaped top pieces and the flat bottom pieces, for example, teeth-dent coupling mechanism, which prevents gas escaping from the oven space. This teeth-dent coupling significantly increases contact areas and complexity of the gas escaping routes between the top and the bottom pieces of a modular thermal control component to maintain gases inside the reaction oven. Some soft materials, such as PTFE seal tape, graphite cloth and ceramic fiber cloth, can be applied between the contact surfaces to increase gas tightness, if necessary. The modular thermal control components also include teeth-dent coupling designs on both cross sides to tightly connect with other pieces. The chamber 203 represents the reaction chamber and 106 is the outer vacuum chamber, as shown in FIG. 1 as well.

Figure 3:
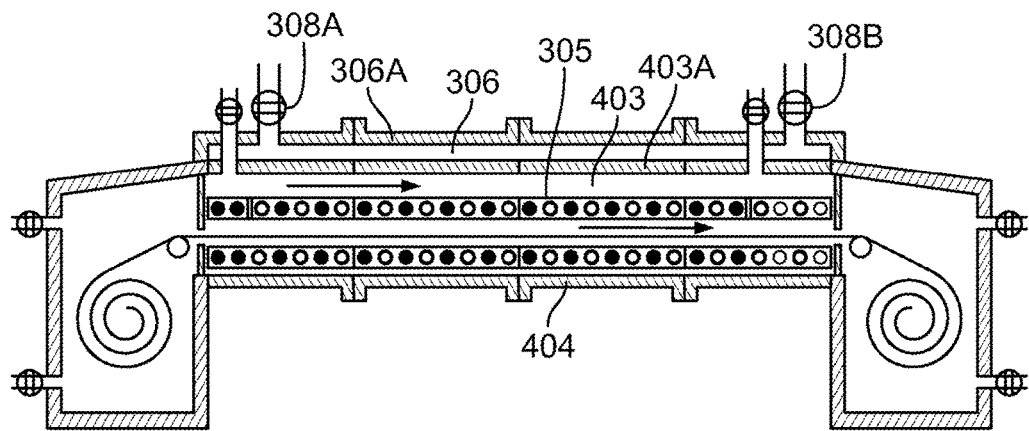
FIG. 3 shows a simplified apparatus without a vacuum chamber at the bottom.
Figure 4:
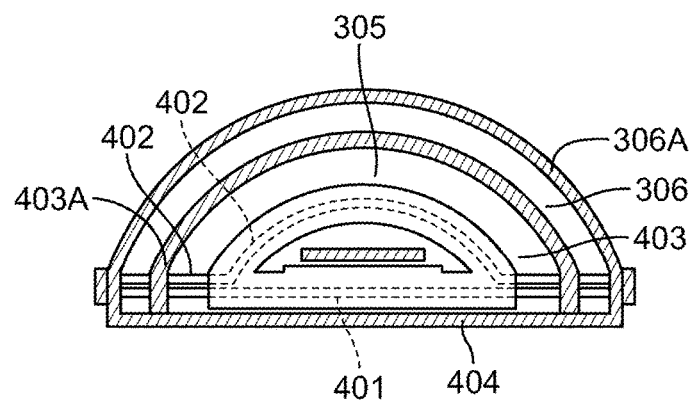
FIG. 4 is the cross-section view of a modular heating section of the simplified apparatus shown in FIG. 3.

In another aspect of the embodiment as shown in FIG. 3, the reactor is simplified by having the outer vacuum chamber 306 only above the reaction chamber 403. Furthermore, the oven is more close to the bottom of the reactor, substantially without an empty space between the reaction oven 305 and the bottom of the reaction chamber 403. This requires the bottom of the whole device to be constituted with excellent heat insulation materials. Alternatively, these heat insulation materials (not shown) must be placed between the reaction oven 305 and the base section 404 of the reaction chamber wall 403A. With this modification, the original valves 108A and 108B in FIG. 1 have to be removed to the top of the apparatus, as shown in the valves 308A and 308B in FIG. 3. This modified device can also be seen in FIG. 4 from a cross-section view. As shown, the outer vacuum chamber 306 surrounds the top wall of the reaction chamber 403. The outer vacuum chamber 306 is formed between an outer vacuum chamber wall 306A and the reaction chamber wall 403A that consists of two side walls and a curved ceiling. The outer vacuum chamber wall and the reaction chamber wall may have shared the base sections 404.

Figure 5:
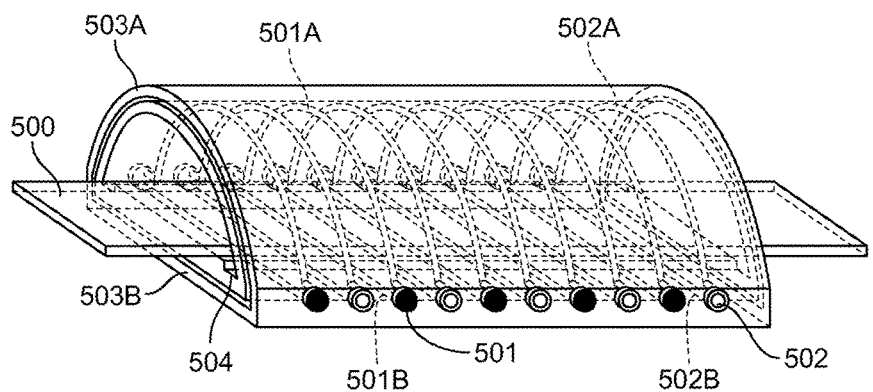
FIG. 5 is a 3D illustration of a modular thermal control component with arrangement of heating elements and thermocouples in a modular heating section.

FIG. 5 shows a three-dimension illustration of an exemplary modular thermal control component used in the present invention. It possesses an arc-shaped rather than a flat ceiling. An arc-shaped ceiling has some benefit over a flat one. If this reactor is used for the reaction of a CIGS absorber layer at a temperature ranging from 400 to 600° C., the unreacted Se will be evaporated into the gas atmosphere. If too much Se evaporates, its local concentrations above the substrate may be over-saturated and condensed even at such a high temperature. The over-saturated liquid Se may condense on the flat-shaped ceiling and drop down onto the reacted CIGS absorber surface to damage some areas of the film. If the liquid Se is condensed on an arc-shaped ceiling, however, it may flow down along the arc to the side grooves 504. On the other hand, a flat-shaped ceiling will result in right-angled corners. The gas stream may be eddy-flowing or back-flowing around these corners, which may be another reason to cause the Se condensation. An arc-shaped ceiling may avoid this problem since it does not have a dead corner. The disadvantage of this arc-shaped ceiling is that it may generate non-uniform temperature distribution for the cross-section segment area because the distance from the center is different from the sides. Since the main heat transfer mechanisms are the heat conduction and the thermal convection in a gas atmosphere, however, the thermal radiation non-uniformity arising from the different distance may be ignored if this arc is not too sharp. There are also some advantages for a modular thermal control compartment to consist of a top piece and a bottom piece but not a single part. It is easy to fabricate, which significantly reduces manufacture costs. It is easy to operate and maintain as well since the top piece can be opened.

In FIG. 5, the heating elements are represented with 501 that consists of a top piece 501A and a bottom piece 501B. Similarly, the thermocouple 502 is constituted from a top piece 502A and a bottom piece 502B. Every pair of heating elements and thermocouples can be independently controlled to adjust the local temperature. A pair of grooves 503A and 503B are cut in to tightly hold the teeth from the matched piece of a modular thermal control component in another modular heating section. The distance between the substrate 500 and the center of the ceiling may be designed from 10 to 200 mm, preferably 20-80 mm to hold sufficient Se vapor pressure inside the reaction/annealing oven.

Figure 6:
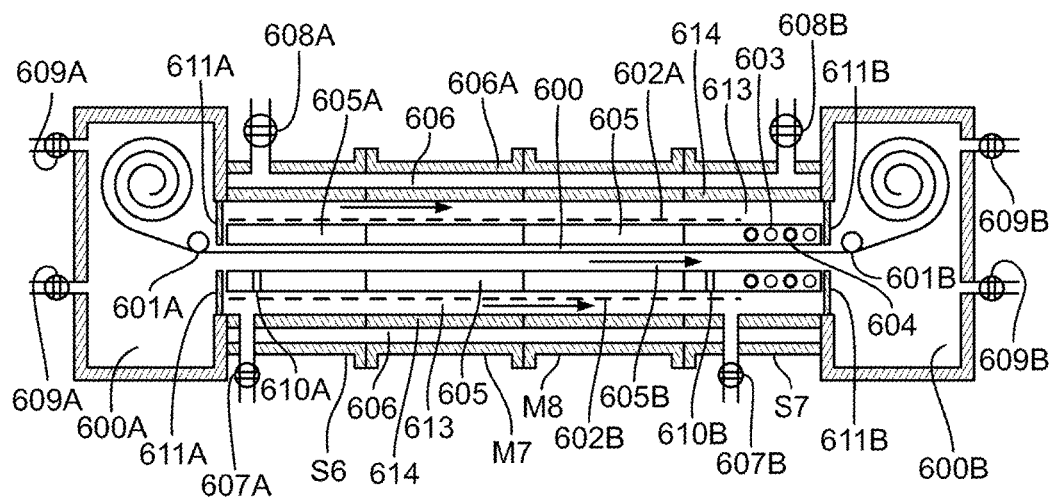
FIG. 6 shows an apparatus with two modular heating sections in the center and an upside-down precursor layer for its reaction on a flexible foil substrate to fabricate an absorber layer in a Group IB-IIIA-VIA or IIB-VIA solar cell with a roll-to-roll process.

FIG. 6 illustrates another embodiment of the reactor. In this design, the precursor layer on a flexible substrate has been turned to an upside-down position. Since most of the flexible substrates going through a high temperature reaction are made from metals, they can support a large tension for the substrate delivery. Therefore, it should not have a significant gravity sag in the center of the substrate if it transports over 10 meters without any support between the unwinding and the winding chambers. As a result, a long substrate roll can be delivered through the entire oven combined with a series of modular thermal control components in different modular heating sections without touching the bottoms. If the roll material is too heavy or too thin to support a high tension force, however, the reacted surface may touch the oven bottom in the center. To avoid this situation, the reaction oven space can be designed with a slightly curved shape.

In various aspects of the embodiment, as shown in FIG. 6, the reactor includes an unwinding chamber 600A, an RTP compartment S6, a cooling compartment S7, at least one modular heating section M7 (and as shown, plus M8) installed between the RTP and the cooling compartments, and a winding chamber 600B. A reaction oven 605 is located inside a reaction chamber 613 with a length expanded from S6 to S7. The reaction chamber 613 is enclosed by modular reaction chamber wall 614, and the reaction oven 605 includes an oven space 605B, one or more modular thermal control compartments 605A, one or more heating modules 602A and 602B, one or more pieces of cooling tubing 603, one or more thermocouples 604, one or more gas inlets 610A and gas outlets 610B to said oven space 605B, and two pairs of shutters 611A and 611B at ends of the reaction oven. The oven space has a rectangular cross-section shape with an internal height between 10 and 200 millimeters, and an internal width between 100 and 2000 millimeters. The reaction oven 605 is configured in such a way that a flexible substrate 600 can be delivered through said oven, and the reactor is adapted to be used in a roll-to-roll process over a continuous flexible substrate to carry out reactions at the down side of said flexible substrate in an elevated temperature under a controlled atmosphere. In a further aspect, the temperature inside the reaction oven is adapted to be controllable from 25 to 1000° C., and preferably from 100 to 800° C.

In another aspect, length of the reactor is adjustable by adding or reducing numbers of the modular heating sections M7 and M8. In addition, the reaction chamber wall 614 may be made from one or more materials of stainless steel, titanium, and aluminum alloy. In various aspects, the reaction chamber includes at least a gas inlet 607A and a gas outlet 607B, which may also function as vacuum valves. Moreover, some vacuum outlets with valves (not shown) may be applied to some modular heating sections to connect with some turbomolecular pumps to obtain a high vacuum. The reaction chamber 613 surrounds the whole reaction oven, and there is free space all around the reaction oven 605 between the reaction oven and the reaction chamber wall 614. The space adds insulation between the reaction oven and the reaction chamber wall. In other various aspects, there may be substantially not any free space between the reaction oven and the bottom reaction chamber wall. Under this circumstance, some kind of insulating material (not shown) may be placed between the reaction oven 605 and the bottom of the reaction chamber wall 614.

Furthermore, the reactor includes an outer vacuum chamber 606 surrounding the whole reaction chamber 613. This outer vacuum chamber is enclosed by one or more pieces of vacuum chamber walls 606A. There may be one or more channels with valves (not shown) to communicate the outer vacuum chamber and the reaction chamber if necessary. As a simplified style, the reactor may further include an outer vacuum chamber that substantially covers only the top wall of the reaction chamber (not shown).

As shown in FIG. 6, the substrate roll 600 starts in the unwinding chamber 600A connected with the RTP compartment S6, passes the roller 601A and goes through the annealing/reaction oven 605 that includes several pieces of modular thermal control components, then passes the roller 601B, and ends in the winding chamber 600B connected with the cooling compartment S7. The other structure and mechanisms are similar to the apparatus shown in FIG. 1, except for some modifications for the upside-down requirements and the modular thermal control components. In these modifications, the gas/vacuum inlets 107A and outlet 107B in FIG. 1 are turned down as 607A and 607B in FIG. 6, and the gas holes 110A and 110B in the annealing/reaction oven are opened in the bottom side of the oven as 610A and 610B as well. Moreover, the vacuum valves 108A and 108B of the outer vacuum chamber 106 in FIG. 1 are turned up as 608A and 608B in the outer vacuum chamber 606 of FIG. 6. Two pairs of shutters 611A and 611B possess the same function as their analogues 111A and 111B in the FIG. 1 device. The functions of the valves 609A and 609B in this figure are also the same as their analogues 109A and 109B in FIG. 1. The whole operation procedure for this apparatus is similar to the one shown in FIG. 1, as described above.

Figure 7:
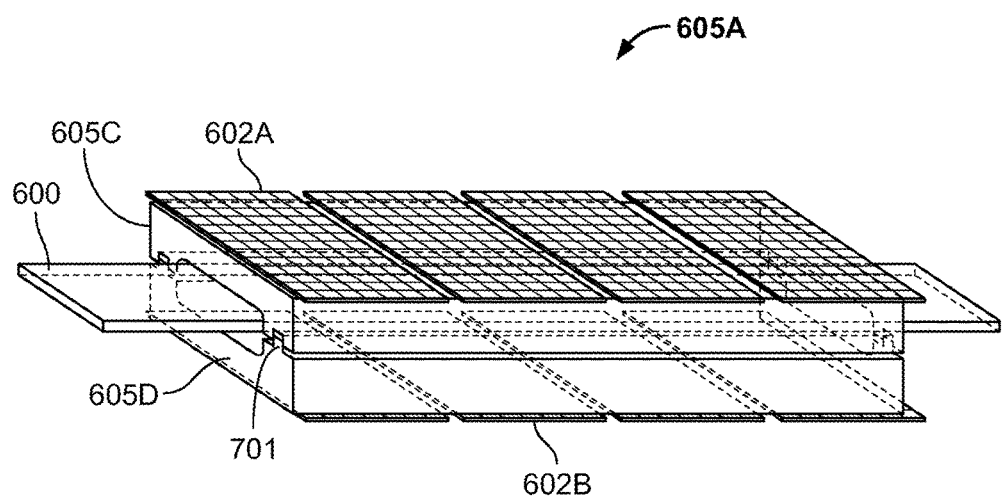
FIG. 7 is a 3D illustration of a modular thermal control component to anneal or make a reaction of a precursor on an upside-down delivered flexible substrate with arrangement of heating modules containing the heating elements and some thermocouples in a modular heating section.

The main difference in this apparatus shown in FIG. 6 is its modular thermal control components 605A. The heating elements and the thermocouples are not arranged inside the oven material but above and underneath it. The oven shape is changed to a rectangle shape with round internal corners. Some heating modules 602A and 602B that contain heating elements and thermocouples to independently control temperatures are arranged closely above and underneath the rectangular shaped oven materials, as shown in FIG. 7 for its details. The cooling compartment is still similar to the one shown in FIG. 1. It contains the thermocouples 603 and the cooling tubing 604.

As shown in FIG. 7, this rectangular modular thermal control component 605A contains an upper piece 605C and a bottom piece 605D, which makes it much easy to fabricate with a low cost. Between the contact areas of 605C and 605D, pairs of teeth and dent cuts are made along the whole sides, respectively, in 605C and 605D, as 701 marked. This prevents the gas inside the modular thermal control components from escaping out of the oven. Similarly, the similar teeth-dent structures (not shown in FIG. 7) are fabricated on the end sides of every modular thermal control component to remain the gas inside the oven as more as possible. FIG. 7 also shows some top heating modules 602A and some bottom heating modules 602B. These modules contain the heating elements and the thermocouples. Every one of them can be independently controlled to adjust the temperatures. If the oven materials are good heat conductive materials such as graphites and conductive ceramics, these heating modules can control the oven temperature very well. Because these modular thermal control components are working in corrosive atmosphere, the material to make these heating modules shall be corrosive resistant, such as stainless steel, molybdenum, titanium or ceramics. If they are made from stainless steel, it is suggested to coat Mo on the surfaces to prevent any possibility of iron release at a high temperature. The round internal corners of this modular thermal control component are designed as round shapes to reduce the eddy gas flowing, as shown in FIG. 7. The width of the reaction oven depends on the web width, generally 100-2000 millimeters, and the internal height of the oven is between 10 and 200 millimeters, preferably 30-80 millimeters.

There are some advantages for this upside-down design. If this reactor is used to prepare CIGS absorbers under an inert gas atmosphere and excessive amounts of Se is precoated on the top of the precursor film, for example, lots of Se will be evaporated from the top during a high temperature heating since the Se evaporation has an opposite direction from the Se thermal diffusion into the CIGS precursor. An upside-down design can significantly reduce the Se evaporation because directions of the Se evaporation and its thermal diffusion into the precursor are the same. As a result, less excessive Se consumption shall be expected, and a better process control and a more stable reaction shall be predicted since less Se is remained inside the inert gas. If this reaction needs to be carried out under a $H_2S$ or $H_2Se$ gas, this upside-down design should be benefit for the gas diffusion into the CIGS precursor coating. Another advantage for this upside-down arrangement is that the oversaturated Se vapor is not easy to condense on a moving substrate. Any possibly condensed Se liquid can only drop down to the back side of the substrate but not damage the absorber material.

Example 1: Post-Treatment of a CdTe Film in $CdCl_2$:Ar:$O_2$ Atmosphere

A CdTe solar cell deposited on a flexible substrate can only be a substrate configuration. In this example, a stainless steel roll coated with Mo may be used as a substrate and CdTe and CdS layers can be deposited with the methods of a vacuum evaporation and a chemical bath deposition (CBD), respectively. After CdTe and CdS deposition, a $CdCl_2$ anneal is usually required to increase the solar cell efficiency because the anneal increases the open circuit voltage $V_{oc}$ and the fill factor FF. Several mechanisms for these improvements have been proposed, such as the elimination of fast-recombination centers in the CdTe film, reduction of recombination centers in the junction, and the elimination of small grains at the grain boundaries.

An apparatus shown in FIG. 1 with 10 meter long oven, assembled with 10 pieces of one-meter long modular heating sections, may be used to anneal CdTe absorber/CdS window layers. The roll coated with CdTe/CdS may be loaded and the whole equipment may be vacuumed down to a level of $10^{-3}$ Pa and remained for about 15 minutes with the valves 107A, 107B, 109A and 109B connected to the vacuum sources. Then turn off the vacuum pumps and close one of the vacuum valves 109A and 109B, plus the valve 107B, followed by filling an inlet gas argon (Ar) to about $10^5$ Pa from one of the gas valves 109A and 109B, and the valve 107A. Repeat this cycle twice before heating the oven up to 420° C. Then the substrate may be delivered at a speed of one meter per minute. Meanwhile, a gas mixture of $CdCl_2$:Ar:$O_2$ may be introduced from the valve 107A with the partial pressures p($CdCl_2$) from 0.65 to 1.2 Pa and p($O_2$) from $1.5 \times 10^3$ to $2 \times 10^4$ Pa. The valve 107B may be partially turned on to remain a gentle gas flowing. The escaped gases should be led to a well sealed chemical treatment system (not shown). During annealing, one of the valves 108A and 108B is opened to a vacuum pump to remain the outer chamber 106 under vacuum. After the annealing completes, the system should be vacuumed again to remove the residue gases before opening the chambers.

Example 2: Selenization of a CIG Precursor Layer in $H_2Se$/$H_2S$ Gas Atmosphere to Form CIGS Absorber In a CIGS thin film solar cell, formation of the CIGS absorber may need several steps. In a traditional method, a CIG precursor was generated firstly through some different methods, vacuum or non-vacuum, then the CIG precursor was selenized under $H_2Se$ or $H_2Se$/$H_2S$ atmosphere at an enhanced temperature to form a stoichiometric CIGS absorber. Because $H_2Se$ is a kind of extremely toxic gas, it has been much less used today. However, it is still used sometimes because this gas-solid selenization reaction may generate a better quality CIGS absorber.

Due to its high toxicity, $H_2Se$ is hard to prepare and store. Therefore, a $H_2Se$ gas cylinder is very expensive. A more economical $H_2Se$ gas source may be from an in-situ generation. For example, the solid Se or S can be reduced by $H_2$ at an enhanced temperature to generate $H_2Se$ and $H_2S$ gases which can be introduced into the present apparatus for a selenization reaction. This reactor is not shown in the current invention. In this example, a flexible substrate roll coated with CIG precursor layer is loaded into an apparatus described in Example 1 and the vacuum-inert gas cycles are applied as described in Example 1. During the vacuum-inert gas cycles, a longer time, i.e., 20-30 minutes, to remain the system under a high vacuum may be necessary. Then the main vacuum chamber is filled with ultra-pure Ar. The oven temperature may be set between 500 and 550° C. After the oven temperature becomes stable, the substrate may be delivered at a speed of one meter per minute. Make sure one of the valves 108A and 108B to be opened to vacuum and the possible residues to be delivered to a sealed chemical treatment system (not shown). Make sure that enough $H_2Se$ and $H_2S$ gas sensors are installed around the working space. The shutters 111A and 111B may be closed to leave a narrow slit between 2 and 4 mm and some Ar from one of the valves 109A and 109B is gently released into the oven through these two shutter slits. The reaction gas, $H_2Se$ or $H_2Se/H_2S$ mixture, may be introduced into the oven through the valve 107A at a pressure about $10^3$ Pa. This gas may be diluted with about 5% Ar flowing from the slit 111A. The valve 107B should be opened and the escaped toxic gas should be delivered into the sealed chemical treatment system. After the reaction completes, the gas supply is stopped and the valve 107A is turned off. After the heating is stopped, the inert gas should be purged and the vacuum-inert gas cycle should be applied again to remove the residue gas before the chambers are opened.

If the reaction has to be carried out in two different gas atmospheres, i.e., $H_2Se$ and $H_2S$, the modular buffer sections can be modified with a gas outlet followed by a gas inlet for different gas ambient. Another gas outlet may be opened in this transition zone between these gas outlet and inlet to remove the mixed gases.

Example 3: Selenization of a CIGS Precursor Layer Under an Inert Gas Ambient

As described in Example 2, the selenization under a $H_2Se$ ambient is not common today. Commonly, the selenization is carried out in two ways. On one hand, Cu, Ga, In and Se are co-deposited and selenized, or Se is continuously supplied during a vacuum deposition of Cu, In and Ga. The selenization may have been completed during these processes. If not, the CIGS precursors may need annealing in a reactor as shown in the present invention. On the other hand, a CIGS precursor film may be constituted from multiple layers of Cu, Ga, In and Se. The different elements are not reacted during their depositions. Under this circumstance, the CIGS precursor must be reacted and selenized to form a high quality stoichiometric CIGS absorber. The present invention is well suitable for this application.

The apparatus shown in FIG. 1 and FIG. 3 are both good for the selenization reaction. Inside these equipments, the precursor layer faces up. The Se amount in these precursors should be excessive because some Se will evaporate during the reaction at an enhanced temperature, especially if it is deposited on the top. During the selenization reaction, partial Se thermally diffuses down to mix with the other elements and partial Se evaporates up into the ambient. In order to reduce the Se evaporation, the apparatus shown in FIG. 6 is employed as the reactor in this example.

The substrate roll 600 shall be loaded upside down in the unwinding chamber 600A. This roll 600 is delivered over the roller 601A, passing the RTP compartment S6, going through the oven that comprises 10 modular heating sections from M7 to M16, cooled down in the cooling compartment S7, adjusted the position over the roller 601B, and finally ending inside the winding chamber 600B. At least three vacuum-inert gas cycles are performed before heating up the oven. During vacuuming, the vacuum level should be down to $10^{-3}$ Pa and remained at this level for at least 20 minutes. The moving speed of the substrate may be still selected at one meter per minute. The oven can be heated up to 500-550° C. The temperature can be controlled precisely at ±1° C. with the heating modules. The reaction may be carried out in ultra-pure Ar or $N_2$ ambient. The gas may be delivered through the valve 607A, diffuse into the oven through the holes 610A, and then escape out of the hole 610B and the valve 607B. During the reaction, more and more Se may be evaporated into the atmosphere. Therefore, the escaped gas shall be led to a Se recovery device or a treatment system. Because the precursor faces down, there is no condensed Se dropping onto the CIGS absorber.

As described above, this apparatus can be extensively used to anneal and/or make the reaction of Group IB-IIIA-VIA or Group IIB-VIA solar cell absorbers on the flexible continuous substrates with different widths. It can precisely control the temperatures to obtain very uniform temperature distribution on the reacted precursors. It is vacuum tight to reach a high vacuum. It can make the reactions under different ambient, i.e., vacuum, inert gas or toxic gas.

The invention claimed is:

1. A vacuum-tight reactor, comprising:
   a rapid thermal process (RTP) compartment;
   a cooling compartment;
   at least one modular heating section, installed between said RTP compartment and said cooling compartment, including one or more modular thermal control components and modular reaction chamber wall; and
   a reaction oven that has an oven space enclosed by said one or more modular thermal control components, one or more heating elements, one or more pieces of cooling tubing, one or more thermocouples, one or more gas inlets to said oven space, and one or more gas outlets to said oven space;
   wherein said oven space possesses a central internal height between 10 and 200 millimeters, and an internal bottom width between 100 and 2000 millimeters; and
   wherein said reaction oven is configured in such a way that a flexible substrate can be continuously delivered through said oven in a roll-to-roll process.

2. The reactor of claim 1, wherein the length of the reactor is adjustable by adding or reducing numbers of the modular heating sections.

3. The reactor of claim 1, wherein:
   said modular thermal control component includes one arc shaped top piece and one flat bottom piece;
   each of said arc top pieces and said flat bottom pieces includes one or more items selected from the group consisting of heating elements, thermocouples and cooling tubing; and
   said modular thermal control component includes teeth-dent coupling designs on both contact surfaces of an arc top piece and a flat bottom piece and cross sides of the component to tightly connect different pieces together to avoid gas escape.

4. A vacuum-tight reactor, comprising:
   a rapid thermal process (RTP) compartment;
   a cooling compartment;
   at least one modular heating section installed between said RTP compartment and said cooling compartment; and
   a reaction oven that includes one or more modular thermal control components, one or more heating elements, one or more pieces of cooling tubing, one or more thermocouples, and one or more gas inlets and one or more gas outlets to said oven space;
   wherein said modular thermal control component includes a top piece and a bottom piece;
   wherein said oven space possesses a rectangular cross-section shape with an internal height between 10 and 200 millimeters, and an internal width between 100 and 2000 millimeters; and wherein said reaction oven is configured in such a way that a flexible substrate can be continuously delivered with its reacting surface down through said oven in a roll-to-roll process.

5. The reactor of claim 4, wherein the length of the reactor is adjustable by adding or reducing numbers of the modular heating sections.

6. The reactor of claim 4, wherein said modular thermal control component includes a top piece and a bottom piece with a teeth-dent coupling design on their contact surfaces to avoid the gas escaping, and the same design is applied on both end sides to tightly connect with other pieces of modular thermal control components.

* * * * *